(12) United States Patent
Ryan et al.

(10) Patent No.: US 10,062,560 B1
(45) Date of Patent: Aug. 28, 2018

(54) METHOD OF CLEANING SEMICONDUCTOR DEVICE

(71) Applicant: GLOBALFOUNDRIES INC., Grand Cayman (KY)

(72) Inventors: Kevin J. Ryan, Albany, NY (US); Shariq Siddiqui, Albany, NY (US); Frank W. Mont, Troy, NY (US); Cornelius B. Peethala, Albany, NY (US)

(73) Assignee: GLOBALFOUNDRIES INC., Grand Cayman, KY (US)

( * ) Notice: Subject to any disclaimer, the term of this patent is extended or adjusted under 35 U.S.C. 154(b) by 0 days.

(21) Appl. No.: 15/497,647

(22) Filed: Apr. 26, 2017

(51) Int. Cl.
| | |
|---|---|
| *H01L 21/44* | (2006.01) |
| *H01L 21/02* | (2006.01) |
| *C25F 1/00* | (2006.01) |
| *H01L 21/768* | (2006.01) |
| *H01L 21/027* | (2006.01) |

(52) U.S. Cl.
CPC .......... *H01L 21/02068* (2013.01); *C25F 1/00* (2013.01); *H01L 21/0274* (2013.01); *H01L 21/76877* (2013.01)

(58) Field of Classification Search
CPC ................. H01L 21/02068; H01L 21/0274
USPC ........................................... 438/666
See application file for complete search history.

(56) References Cited

U.S. PATENT DOCUMENTS

| | | | |
|---|---|---|---|
| 5,676,760 A | 10/1997 | Aoki et al. | |
| 6,565,736 B2 | 5/2003 | Park et al. | |
| 2003/0062068 A1 | 4/2003 | Ko et al. | |

*Primary Examiner* — Anthony Ho
(74) *Attorney, Agent, or Firm* — Yuanmin Cai; Hoffman Warnick LLC

(57) ABSTRACT

Aspects of the present disclosure provide a method of cleaning a semiconductor device. The method includes providing a semiconductor wafer having an exposed cobalt surface and rinsing the exposed cobalt surface with cathode water having a pH greater than 9 and an oxidation reduction potential of less than 0.0.

20 Claims, 5 Drawing Sheets

METHOD OF CLEANING SEMICONDUCTOR DEVICE

FIELD OF THE INVENTION

The present application relates to the manufacturing of a semiconductor device. More particularly, the present application relates to a method of cleaning a semiconductor device wherein exposed cobalt surfaces occur during the manufacturing.

BACKGROUND

Metallic tungsten (W) has been the primary conductor for contacts in semiconductor devices. As semiconductor nodes are scaled down, the transistors and contacts become increasingly smaller. Tungsten (W) has been shown to form a highly resistive beta phase at trench dimensions of less than 15 nanometers (nm). This property of W creates a problem for advanced nodes including 7 nm and 10 nm nodes.

Cobalt has been proposed as a substitute for tungsten. However, cobalt presents additional challenges in the manufacture of semiconductor devices.

BRIEF SUMMARY

A first embodiment of the present disclosure discloses a method of cleaning a semiconductor device. The method includes providing a semiconductor wafer having an exposed cobalt surface and rinsing the exposed cobalt surface with cathode water having a pH greater than 9 and an oxidation reduction potential of less than 0.0.

A second embodiment of the present disclosure is a method of cleaning a semiconductor device. The method includes providing an electrolyzer including a cathode cell having a cathode, an anode cell having an anode and an ion exchange membrane separating the cathode cell and the anode cell. The method includes supplying deionized water to the cathode cell. The method includes supplying deionized water having $NH_4OH$ at a concentration of 100 parts per million (ppm) to 1000 ppm to the anode cell. A voltage is applied between the anode cell and the cathode cell whereby the cations pass through the ion exchange membrane to raise the pH of the deionized water in the cathode cell to greater than 9 and an oxidation reduction potential of less than 0.0. The water from the cathode cell is supplied to a semiconductor wafer having an exposed cobalt surface to clean the semiconductor wafer.

A third embodiment of the present disclosure is a method of cleaning and passivating a semiconductor device. The method includes providing an electrolyzer including a cathode cell having a cathode, an anode cell having an anode and an ion exchange membrane separating the cathode cell and the anode cell. Deionized water is supplied to the cathode cell. Deionized water having $NH_4OH$ at a concentration of 100 parts per million (ppm) to 1000 ppm is supplied to the anode cell. A voltage between the anode cell and the cathode cell is applied whereby the cations pass through the ion exchange membrane to raise the pH of the deionized water in the cathode cell to greater than 9 and provide an oxidation reduction potential of less than 0.0. The water from the cathode cell is supplied to a semiconductor wafer having an exposed cobalt surface, wherein the exposed cobalt surface contains cobalt oxide (CoO) and cobalt fluoride ($CoF_2$) for a time sufficient to passivate and clean the semiconductor wafer.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure will now be described by reference to the accompanying figures. In the figures, various aspects of the structures have been shown and schematically represented in a simplified manner to more clearly describe and illustrate the disclosure. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the disclosure is not limited to constructions of any particular shape.

Resistance of contacts in integrated circuits (ICs) has become an issue as IC's have become smaller. Because tungsten forms a highly resistive beta phase at small feature sizes, advanced nodes can have unacceptable resistances when using tungsten contacts. Cobalt (Co) does not form a resistive phase at sizes used in advanced nodes and can be used for contacts. However, cobalt presents challenges in the manufacturing of semiconductor devices.

Microelectronics chips such as integrated circuits (ICs) are made from comparatively large semiconductor wafers. This process typically involves multiple successive steps including the following: generation of a photolithographic etch mask; etching of a layer of material as defined by the mask; removal of the photolithographic mask through some combination of wet and dry chemical techniques; and deposition of layers of materials. The photolithographic mask is formed from a polymeric material called a photoresist. After the photoresist mask has been removed, a wet cleaning process is performed. After the wet cleaning process, the semiconductor device is dried, typically by rinsing with a volatile solvent, such as isopropyl alcohol, followed by spin drying.

Deionized (DI) water is known for its use in the rinsing of semiconductor devices. DI water is known to prevent metal corrosion and contamination of the devices. In order to make the wet cleaning more effective, carbon dioxide ($CO_2$) may be mixed with the DI water. Rinsing with carbonated deionized ($DI$-$CO_2$) water is an electrically inert process that prevents static discharge in semiconductor devices. $DI$-$CO_2$ water is the standard rinse solution used in the wet cleaning process. DI-$CO_2$ prevents electrical discharge. However, DI-$CO_2$ water has been shown to attack exposed cobalt surfaces during the rinse step.

Figure 1:
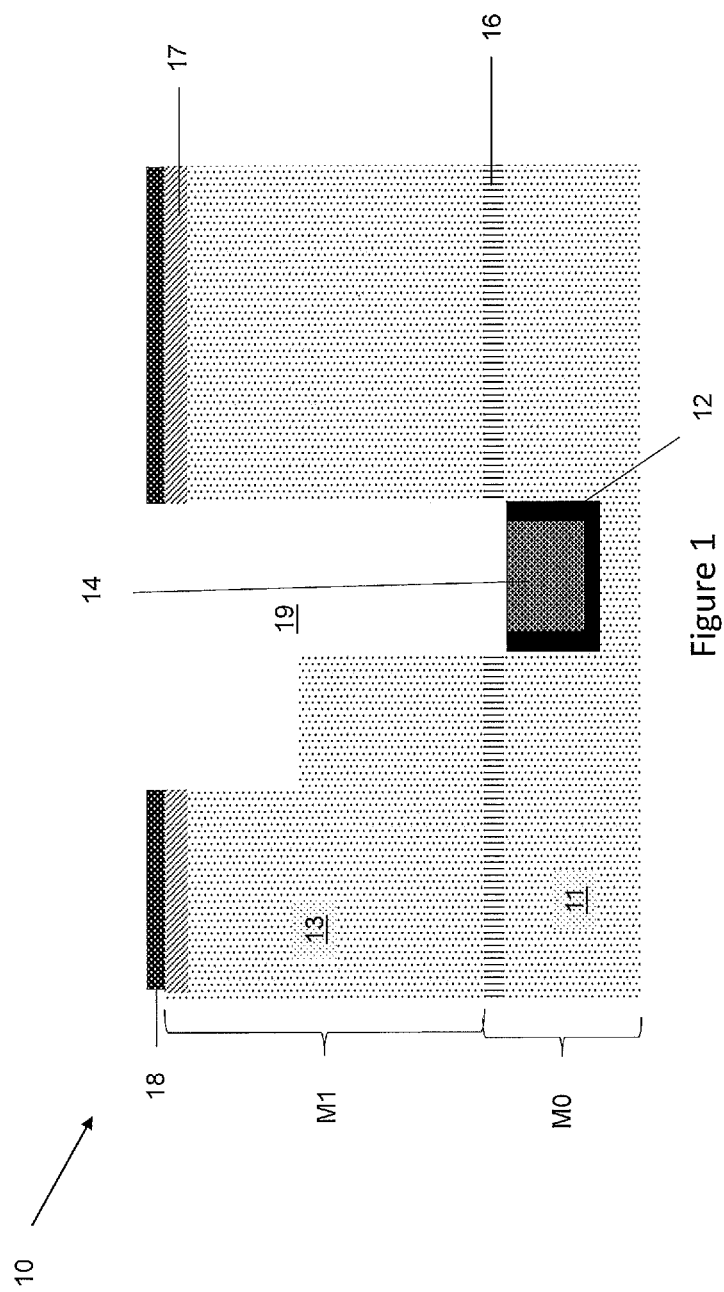
FIG. 1 illustrates a cross-sectional view of an embodiment of a semiconductor device having a cobalt contact.

FIG. 1 depicts an exemplary semiconductor device having an exposed cobalt surface. The present disclosure provides details concerning wet cleaning an exposed cobalt surface in a semiconductor device, such as, memory devices, resistors, diodes, capacitors, and other semiconductor devices, such as finFETs, Schottky barrier MOSFETS, and bipolar junction transistors.

FIG. 1 shows a semiconductor device 10 having a dielectric layer 11. A cobalt contact 14 or plug is disposed within dielectric layer 11. In an embodiment shown in FIG. 1, cobalt plug 14 is surrounded by barrier layer 12, such as titanium nitride or another refractory material or metal alloy. A dielectric cap 16 may be disposed on an upper surface of dielectric layer 11. In FIG. 1, dielectric layer 11, cobalt contact 14 and dielectric cap 16, may be at, for example, a zero metal level, referred to as level M0. Disposed on the M0 layer, is a second dielectric layer 13, an optional cap layer 17 and a mask layer 18. Cap layer 17 may include any dielectric material known in the art such as, for example, a nitride. Mask layer 18 may be any now known or layer developed material such as titanium nitride. Dielectric layer 13 and cap layer 17 are referred to as a first metal layer M1. FIG. 1 shows device 10 after etch processes have been performed to form opening 19 and expose a surface of cobalt plug 14. Although shown as M0/M1 stack in FIG. 1, any metal layer may be processed according to the disclosure herein so long as an exposed cobalt surface is present.

In embodiments, etch processes used to create opening 19 include lithographically patterning and etching. In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which then can be etched. Etching generally refers to the removal of material from a substrate (or structures formed on the substrate), and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features.

During etch processes various gases are used to form reactive species. The gases include carbon tetrafluoride ($CF_4$), oxygen ($O_2$), argon (Ar), carbon monoxide (CO) and carbon dioxide ($CO_2$).

The opening 19 in FIG. 1 exemplifies a dual damascene multi-step etch process to form a trench and a via. However, a single etch process, such as single damascene, which forms only a trench, may be treated as described herein if the trench exposes a cobalt surface.

Figure 2:
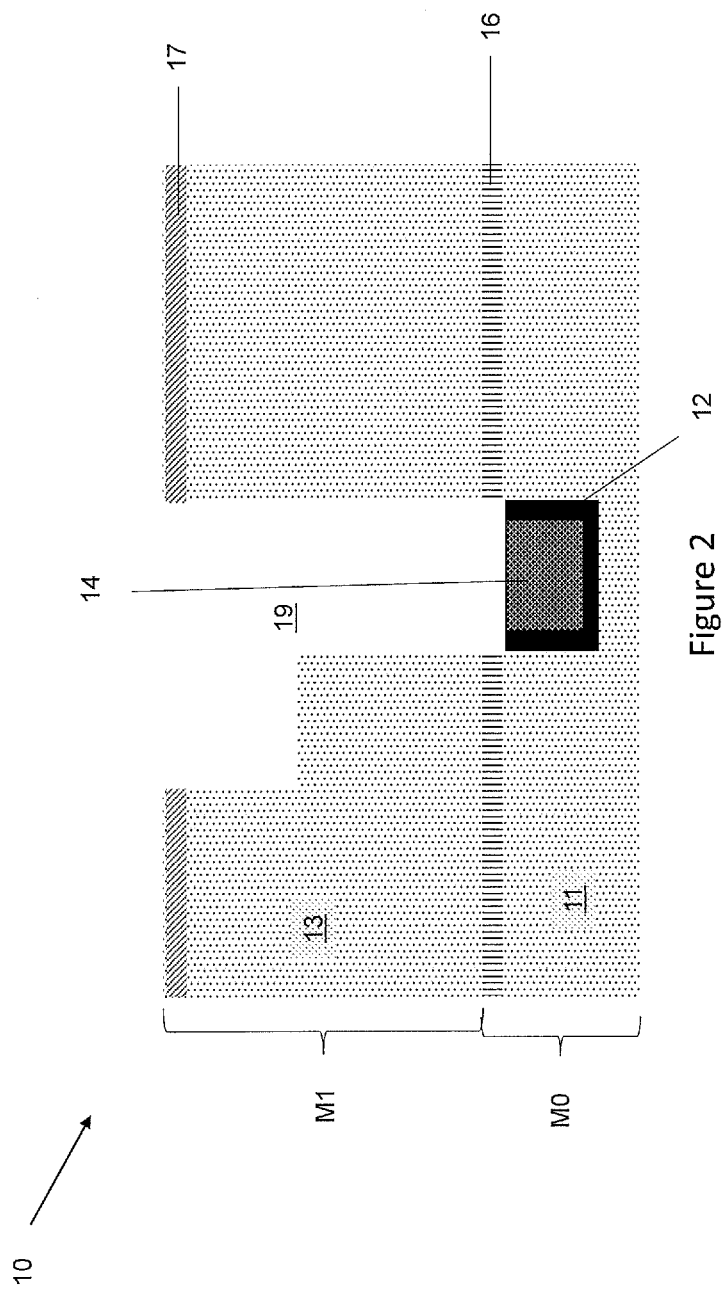
FIG. 2 illustrates a cross-sectional view of an embodiment of a semiconductor device having a cobalt contact.

As shown in FIG. 2, after the etch processes are conducted in FIG. 1, mask layer 18 is removed a wet chemical etch process. Chemical-mechanical-polishing (CMP) is an alternate conventional planarization process which planarizes surfaces with a combination of chemical reactions and mechanical forces and can be used to remove a mask layer. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar.

After the removal of the mask layer 18, any remaining debris is removed from semiconductor device 10 through a rinse solution and then semiconductor device 10 is dried. The rinse solution is typically DI-$CO_2$, as this solvent removes debris and prevents electrostatic discharge which would damage semiconductor device 10. However, when using DI-$CO_2$ of DI water to rinse semiconductor device 10, it has been discovered that DI-$CO_2$ or DI water removes cobalt. This results in loss of cobalt from semiconductor device 10 which results in manufacturing defects of the semiconductor devices.

Dielectric materials of layers 11 and 13 in FIG. 1 and FIG. 2 may include any interlevel or intralevel dielectric material including, for example, inorganic dielectric materials, organic dielectric materials, or combinations thereof. Suitable dielectric materials include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

In some embodiments of the present disclosure, dielectric materials have a dielectric constant that is about 3.0 or less, with a dielectric constant of about 2.8 or less being even more typical. As used herein, "about" or "approximately" indicate +/−10% of the value(s) stated. All dielectric constants mentioned herein are relative to a vacuum, unless otherwise noted. Dielectric materials that have dielectric constants of about 3.0 or less generally have a lower parasitic cross talk as compared with dielectric materials that have a higher dielectric constant than 4.0.

In embodiments, conductive regions (not shown) can be below the cobalt contact 14 in FIG. 1 and FIG. 2. The conductive region can been doped with a p-type or n-type dopant. N-type dopant in a silicon containing material includes type V elements from the Periodic Table of Elements, such as phosphorus and arsenic. P-type dopant in a silicon containing material includes type III elements from the Periodic Table of Elements, such as boron.

Deposition of cobalt in FIG. 1 and FIG. 2 can be by a selective CVD process. In such a process, precursors are used such that the Co will only deposit on a metal surface and not on the dielectric surface. Selective Co deposition is well known by those skilled in the art. Typical processes involve some pre-treatment of the metal surface, such as with hydrogen plasma or argon, followed by introducing a cobalt containing precursor such as cobalt carbonyl of which cobalt is deposited preferentially onto the metal. In embodiments the cobalt can be deposited using PVD and electroplating chemical deposition.

Mask layer 18 is used as a pattern memorization layer for the multiple etch processes. Mask layer 18 allows smaller pitch features to be achieved and protects the underlying dielectric from the etch bombardment and improves the etch profile. The optional cap (SiN) layer 17 is used as an undercutting layer to prevent the etch processes from undercutting the dielectric directly under mask layer 18.

Disclosed herein is a rinse solution or solvent that removes any debris remaining on semiconductor device 10 after removal of mask 18 in FIG. 1 in a wet cleaning process. The rinse solution is referred to as cathode water. This rinse solution can be used after any wet processing step that will be in contact with exposed Co films, for example, after the post etch residue cleans, as well as the TiN metal hard mask removal cleans. The cathode water is deionized water having a pH of greater than 9, or in embodiments greater than 10, or in embodiments greater than 11. The cathode water has an oxidation reduction potential of less than zero. The exposed cobalt surface in FIG. 2 is rinsed with the cathode water for a time to remove any debris on the semiconductor device. The time of the rinse is from 30 seconds to 600 seconds, or in embodiments from 30 seconds to 200 seconds, or from 30 seconds to 180 seconds.

It is theorized that by using cathode water, that is, deionized water in the alkaline pH range (>9) and an oxidation potential of less than zero, as a rinse solution in semiconductor wet processing, wherein the semiconductor wafer has an exposed cobalt surface, the exposed cobalt surface is passivated and there is no dissolution of cobalt. The method disclosed herein cleans the semiconductor wafer and passivates any exposed cobalt surface when exposed for a sufficient time to clean and passivate the exposed cobalt surface.

Figure 3:
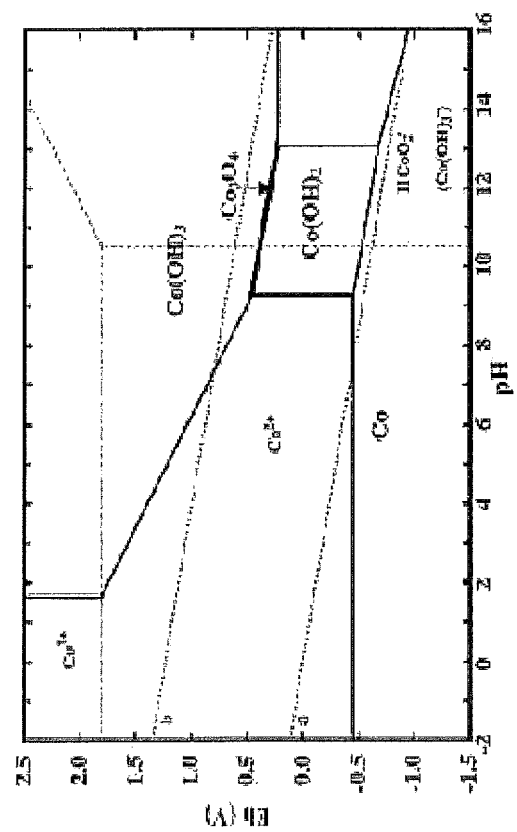
FIG. 3 illustrates a Pourbaix diagram for a cobalt water system.

FIG. 3 shows a Pourbaix diagram for a cobalt-water system. The regions enclosed by solid lines in FIG. 3 indicate the most thermodynamically stable (hence, abundant) form of the metal found for any given potential and pH. If deionized water has a pH greater than 9 and an oxidation reduction potential (ORP) of less than 0.0 to about −0.4, the most stable species, according to FIG. 3, is $Co(OH)_2$. If the deionized water has a pH less than 8, cobalt will dissolve as the most stable species is $Co^{+2}$. Therefore, using cathode water as described herein prevents dissolution of cobalt and passivates the cobalt surface, as any cobalt oxide (CoO) and cobalt fluoride ($CoF_2$) on the exposed surface is converted to cobalt hydroxide ($Co(OH)_2$).

Figure 4:
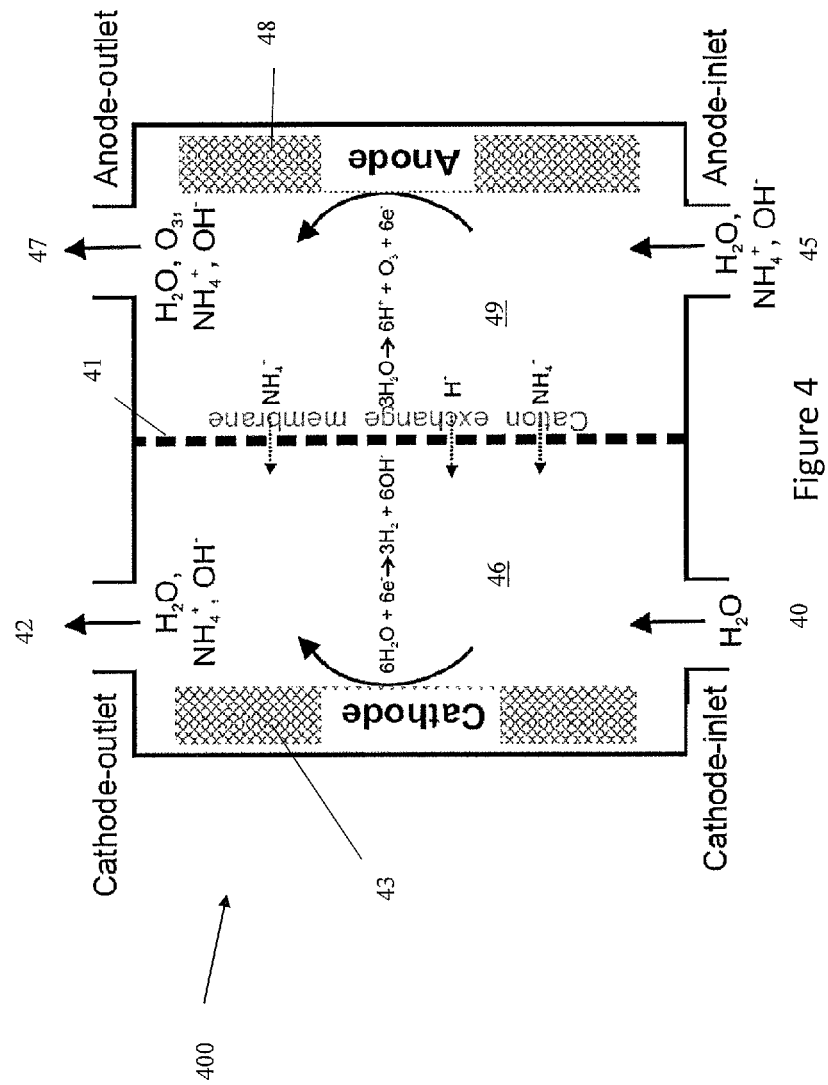
FIG. 4 illustrates a diagram of an electrochemical cell used for producing cathode water.

FIG. 4 shows an electrolyzer 400 suitable for producing cathode water, as described herein. The process includes providing an electrolyzer 400 including a cathode cell 46 having a cathode 43, an anode cell 49 having an anode 48 and an ion exchange membrane 41 separating the cathode cell 46 and the anode cell 49. The process includes supplying deionized water to the cathode cell 46 and supplying deionized water having $NH_4OH$ at a concentration of 100 parts per million (ppm) to 1000 ppm to the anode cell 49. The process includes applying a voltage between the anode cell 49 and the cathode cell 46 whereby cations pass through the ion exchange membrane 41 to raise the pH of the deionized water in the cathode cell to greater than 9. The oxidation reduction potential is less than zero of the deionized water exiting the cathode cell 46 at the cathode cell outlet 42.

At a cathode cell inlet 40, deionized water is introduced to the cathode cell 46. At anode cell inlet 45, deionized water containing $NH_4OH$ at a concentration of between about 100 parts per million (ppm) to about 1000 ppm is introduced to anode cell 49. Anode cell 49 and cathode cell 46 are separated by a cation exchange membrane 41. A voltage is applied between cathode 43 and anode 48. The concentration and potential gradiaent forces cations ($NH_4^+$) to diffuse across the cation exchange membrane 41 lowering the pH of the water in the cathode cell according to:

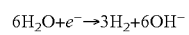

$$6H_2O + e^- \rightarrow 3H_2 + 6OH^-$$

The cation exchange membrane allows only positive ions to pass through. There are in the present case hydrogen ions ($H^+$) and ammonium ions ($NH4^+$). The cathode water is used to rinse a semiconductor wafer having an exposed cobalt surface, as described herein.

A suitable REDOX® electrochemical cell is available from CONDIAS®. The REDOX® electrochemical cell uses boron doped silicon with a boron doped diamond coating as the anode and cathode. The boron doped silicon with a boron doped diamond coating minimizes build-up of scale on the electrodes which results in a long life.

Semiconductor devices as shown in FIG. 2 were subjected to the following standard process using LELELE lithopatterning techniques and a Metal-Hardmask-Trench-First-Via-Last scheme which is standard for BEOL processing. One batch of the semiconductor devices was rinsed with cathode water having a pH of 9. A second batch of devices was rinsed with DI-$CO_2$ water for times ranging from one minute to 10 minutes. The DI-$CO_2$ water had a pH of from about 4 to 5. The resistance of the cobalt plugs was measured after the rinse and dry step. In all cases the resistivity of the cobalt contact increased after rinsing with DI-$CO_2$ water, whereas the resistance of the cobalt contacts rinsed with cathode water remained steady.

Experiments were conducted to determine the effect on the he surface of the cobalt plug 14 in FIG. 2 when the cobalt plug surface was subjected to rinsing with cathode water disclosed herein. After the etch process (RIE) was conducted to expose the surface of cobalt plug 14, X-ray photon spectroscopy (XPS) was conducted on semiconductor device 10 of FIG. 2. XPS showed the presence of oxygen and fluorine on the surface of cobalt contact 14. The etching step causes the cobalt to form cobalt oxide (CoO) and cobalt fluoride ($CoF_2$) on the surface of cobalt contact 14. Fluorinated gases are used as gases in certain etch processes.

Using cathode water not only prevents dissolution of cobalt, but the exposed cobalt surface is passivated as cobalt oxide (CoO) and cobalt fluoride ($CoF_2$) on the surface is converted to cobalt hydroxide ($Co(OH)_2$). The surface of cobalt plug must be cleaned with cathode water to allow further steps to be conducted.

Figure 5:
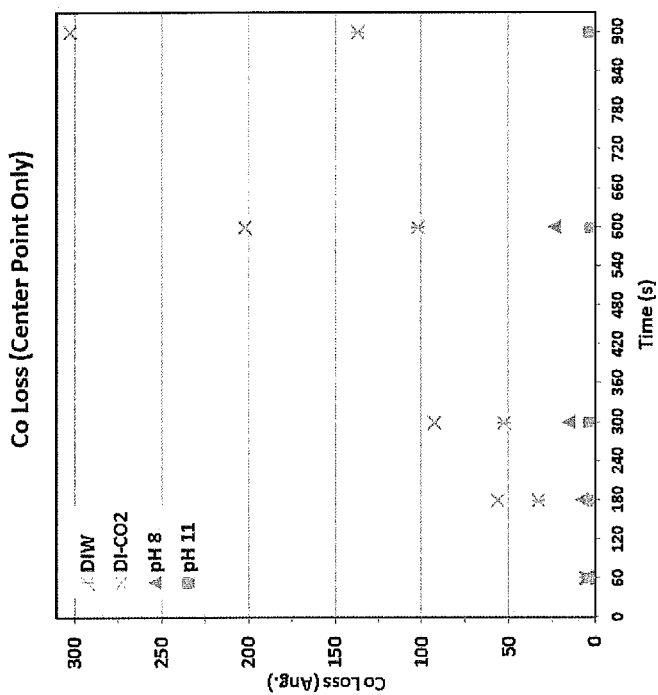
FIG. 5 illustrates a graphical comparison of cobalt loss using various rinse solutions.

FIG. 5 compares cobalt loss on a cobalt surface sprayed with four types of rinse solutions. The solutions were DI water, DI-$CO_2$ water, cathode water at a pH of 8 and cathode water at a pH of 11. The cobalt loss was measured at the center of the cobalt surface. The DI water and DI-$CO_2$ water caused significant Co loss. Cathode water at a pH of 8 lessened the cobalt loss and cathode water at a pH of 11 showed minimal cobalt loss. In summary, cathode water having a pH of 9 or greater, and an oxidation rejection potential of less than zero, prevents cobalt loss is wet cleaning processes of semiconductor devices having an exposed cobalt surface.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method of cleaning a semiconductor device, comprising:
   providing a semiconductor wafer having an exposed cobalt surface; and
   rinsing the exposed cobalt surface with cathode water having a pH greater than 9 and an oxidation reduction potential of less than 0.0.

2. The method of claim 1, wherein the cobalt surface is rinsed for a time of about 30 seconds to about 600 seconds.

3. The method of claim 1, wherein the cathode water has a pH greater than 10.

4. The method of claim 1, wherein the cathode water has a pH greater than 11.

5. The method of claim 1, further comprising producing the cathode water by;
   providing deionized water with a $NH_4OH$ concentration of from 100 parts per million (ppm) to 1000 ppm to an anode cell;
   providing deionized water to a cathode cell, wherein the anode cell and cathode cell are separated by an ion exchange membrane; and
   applying a voltage between the anode cell and the cathode cell whereby the cations pass through the ion exchange membrane to raise the pH of the cathode water.

6. The method of claim 1, further comprising drying the rinsed cobalt surface.

7. The method of claim 6, further comprising metalizing the rinsed cobalt surface.

8. The method of claim 1, wherein the providing a semiconductor wafer having an exposed cobalt surface comprises:
   providing a semiconductor wafer having a mask covering a portion of the semiconductor wafer and not covering regions having the cobalt surface thereunder;
   etching the semiconductor wafer in the regions not covered by the mask to expose a cobalt surface; and
   removing the mask.

9. The method of claim 1, wherein rinsing of the exposed cobalt surface converts cobalt oxide (CoO) and cobalt fluoride ($CoF_2$) to cobalt hydroxide ($Co(OH)_2$).

10. A method of cleaning a semiconductor device, comprising:
    providing an electrolyzer including a cathode cell having a cathode, an anode cell having an anode and an ion exchange membrane separating the cathode cell and the anode cell;
    supplying deionized water to the cathode cell;
    supplying deionized water having $NH_4OH$ at a concentration of 100 parts per million (ppm) to 1000 ppm to the anode cell;
    applying a voltage between the anode cell and the cathode cell whereby the cations pass through the ion exchange membrane to raise the pH of the deionized water in the cathode cell to greater than 9 and an oxidation reduction potential of less than 0.0; and
    supplying the water from the cathode cell to a semiconductor wafer having an exposed cobalt surface to clean the semiconductor wafer.

11. The method of claim 10, wherein the semiconductor wafer is supplied with the water for a time of about 30 seconds to about 600 seconds.

12. The method of claim 10, wherein the semiconductor wafer is supplied with the water for a time of from 30 seconds to 180 seconds.

13. The method of claim 10, wherein the deionized water in the cathode cell has a pH greater than 10.

14. The method of claim 10, wherein the deionized water in the cathode cell has a pH greater than 11.

15. The method of claim 10, wherein supplying the water from the cathode cell to exposed cobalt surface converts cobalt oxide (CoO) and cobalt fluoride ($CoF_2$) to cobalt hydroxide ($Co(OH)_2$).

16. A method of cleaning and passivating a semiconductor device, comprising:
    providing an electrolyzer including a cathode cell having a cathode, an anode cell having an anode and an ion exchange membrane separating the cathode cell and the anode cell;
    supplying deionized water to the cathode cell;
    supplying deionized water having $NH_4OH$ at a concentration of 100 parts per million (ppm) to 1000 ppm to the anode cell;
    applying a voltage between the anode cell and the cathode cell whereby the cations pass through the ion exchange membrane to raise the pH of the deionized water in the cathode cell to greater than 9 and provide an oxidation reduction potential of less than 0.0; and supplying the water from the cathode cell to a semiconductor wafer having an exposed cobalt surface, wherein the exposed cobalt surface contains cobalt oxide (CoO) and cobalt fluoride ($CoF_2$) for a time sufficient to passivate and clean the semiconductor wafer.

17. The method of claim 16, wherein the semiconductor wafer is supplied with the water for a time of about 30 seconds to about 600 seconds.

18. The method of claim 16, wherein the deionized water in the cathode cell has a pH greater than 10.

19. The method of claim 16, wherein the semiconductor wafer is supplied with the water for a time of from 30 seconds to 180 seconds.

20. The method of claim 16, wherein the deionized water in the cathode cell has a pH greater than 11.

* * * * *